(12) United States Patent
Tanigawa et al.

(10) Patent No.: US 12,104,565 B2
(45) Date of Patent: Oct. 1, 2024

(54) IGNITER AND ENGINE IGNITION DEVICE

(71) Applicant: ROHM CO., LTD., Kyoto (JP)

(72) Inventors: Hiroyuki Tanigawa, Kyoto (JP); Atsushi Taguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 18/526,180

(22) Filed: Dec. 1, 2023

(65) Prior Publication Data

US 2024/0102438 A1    Mar. 28, 2024

Related U.S. Application Data

(63) Continuation of application No. PCT/JP2022/020675, filed on May 18, 2022.

(30) Foreign Application Priority Data

Jun. 4, 2021   (JP) .................................. 2021-094274

(51) Int. Cl.
| | |
|---|---|
| *F02P 7/02* | (2006.01) |
| *H01L 23/00* | (2006.01) |
| *H01L 27/02* | (2006.01) |
| *F02P 3/09* | (2006.01) |
| *F02P 17/12* | (2006.01) |

(52) U.S. Cl.
CPC .............. *F02P 7/022* (2013.01); *H01L 24/49* (2013.01); *H01L 27/0266* (2013.01); *F02P 3/093* (2013.01); *F02P 2017/121* (2013.01); *H01L 2224/4912* (2013.01)

(58) Field of Classification Search
CPC ...... F02P 7/022; F02P 3/093; F02P 2017/121; H01L 24/49; H01L 27/0266; H01L 2224/4912
See application file for complete search history.

(56) References Cited

U.S. PATENT DOCUMENTS

| | | | |
|---|---|---|---|
| 7,131,437 B2 * | 11/2006 | Ando ..................... | F02P 3/0552 123/644 |
| 2006/0244496 A1 * | 11/2006 | Kawakita .............. | F02P 3/0552 327/110 |

(Continued)

FOREIGN PATENT DOCUMENTS

| | | |
|---|---|---|
| JP | 2006-299988 | 11/2006 |
| JP | 2019-163720 | 9/2019 |
| JP | 2020-101152 | 7/2020 |

OTHER PUBLICATIONS

International Search Report and Written Opinion in International Appln. No. PCT/JP2022/020675, mailed on Jul. 26, 2022, 16 pages (with machine translation).

*Primary Examiner* — Sizo B Vilakazi
(74) *Attorney, Agent, or Firm* — Fish & Richardson P.C.

(57) ABSTRACT

Provided is an igniter capable of reducing occurrence of malfunction due to noise. An igniter (100) includes a switch element (111) having a first end, a temperature sensor (112) including at least one diode and having a cathode end (112B), a switch element control device (12) configured to control the switch element, and a switch element electrode (Pe) connected to the first end of the switch element and to the cathode end, and the switch element control device has a ground electrode (Pgnd) electrically isolated from the cathode end.

10 Claims, 5 Drawing Sheets

(56) References Cited

U.S. PATENT DOCUMENTS

2010/0059028 A1* 3/2010 Ueno .................. H01L 27/0623
                                                    257/140
2019/0120198 A1* 4/2019 Miyake ................ F02P 3/0442
2019/0293044 A1* 9/2019 Daicho .............. H03K 17/0826

* cited by examiner

IGNITER AND ENGINE IGNITION DEVICE

CROSS-REFERENCE TO RELATED APPLICATIONS

This nonprovisional application is a continuation application of International Patent Application No. PCT/JP2022/020675 filed on May 18, 2022, which claims priority Japanese Patent Application No. 2021-094274 filed on Jun. 4, 2021, the entire contents of which are hereby incorporated by reference.

TECHNICAL FIELD

The present disclosure relates to an igniter and an engine ignition device.

BACKGROUND ART

Conventionally, there is known an igniter for controlling an ignition coil connected to an ignition plug of an engine. An igniter is a device that controls the primary-side voltage of an ignition coil by means of a switch element (e.g., Patent Document 1 identified below).

CITATION LIST

Patent Literature

Patent Document 1: Japanese unexamined patent application publication No. 2020-101152

DESCRIPTION OF EMBODIMENTS

1. Comparative Example

First, before describing an embodiment of the present disclosure, a comparative example will be described. By comparison with the comparative example, advantageous effects and the like of the embodiment of the present disclosure will be made apparent.

<1-1. Overall Configuration>

Figure 1:
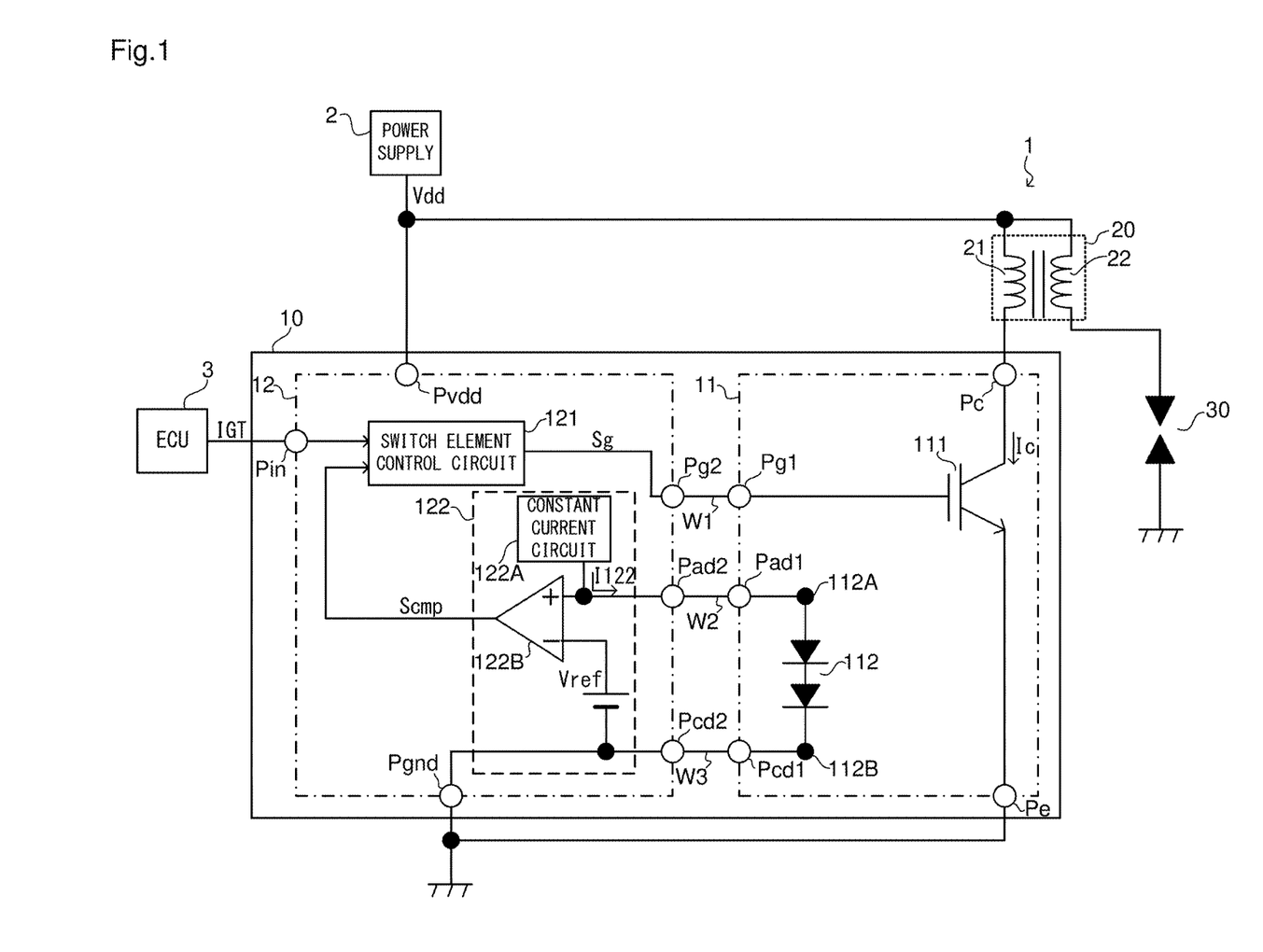
FIG. 1 is a diagram showing a configuration of an engine ignition device according to a comparative example.

FIG. 1 is a diagram showing a configuration of an engine ignition device 1 according to the comparative example. As means for driving an unillustrated gasoline engine, the engine ignition device 1, a power supply 2, and an engine control unit 3 (hereinafter referred to as the ECU (engine control unit) 3) are mounted in a vehicle. The power supply 2 is constituted as a car battery.

The engine ignition device 1, which operates with power supplied from the power supply 2, is means for igniting fuel (=fuel-air mixture of gasoline and air) inside the gasoline engine according to an ignition instruction signal IGT, and includes an igniter 10, an ignition coil 20, and an ignition plug 30.

The igniter 10 is means for driving turning on/off of a primary-side current of the ignition coil 20 (corresponding to a collector current Ic of a switch element 111), and is provided as a semiconductor integrated circuit device in which a switch element chip 11 and a switch element control device 12 are packaged.

The switch element control device 12 is constituted by integrating a switch element control circuit 121 and a temperature detection circuit 122 in one semiconductor chip, and is provided with a function of generating a gate signal Sg of the switch element 111 according to the ignition instruction signal IGT from the ECU 3. Further, the switch element control device 12 is also provided with a function of detecting a temperature of the switch element 111 by means of a temperature sensor 112, which will be described later.

The switch element chip 11 is constituted by integrating the switch element 111 and the temperature sensor 112 in one semiconductor chip. The switch element 111 is turned on/off by the switch element control device 12, and in the present example, an IGBT (insulated gate bipolar transistor) is adopted as the switch element 111. The switch element 111 has its gate connected to the switch element control device 12, has its collector connected to a primary-side coil 21 of the ignition coil 20, and has its emitter connected to a ground potential application terminal. Here, as the switch element 111, a MOSFET (metal oxide semiconductor field effect transistor) may be adopted instead of an IGBT. The temperature sensor 112 is an element for detecting temperature of the switch element 111.

The ignition coil 20 includes the primary-side coil 21 having a number of turns M1 and a secondary-side coil 22 having a number of turns M2 (>M1), and the ignition coil 20 functions to convert (step up) an input voltage (=power supply voltage Vdd), supplied from the power supply 2, into a higher output voltage. A first end of the primary-side coil 21 and a first end of the secondary-side coil 22 are each connected to an output terminal of the power supply 2 (=an application terminal of the power supply voltage Vdd). A second end of the primary-side coil 21 is connected to the collector of the switch element 111. A second end of the secondary-side coil 22 is connected to the ignition plug 30, and the output voltage generated at the second end of the secondary-side coil 22 is supplied to the ignition plug 30.

The ignition plug 30 uses a high voltage obtained by the ignition coil 20 to generate a spark for igniting fuel injected into the unillustrated engine.

The power supply 2 supplies power to various electric components mounted in the vehicle, including the engine ignition device 1.

The ECU 3 executes various controls related to the driving of the vehicle engine. In particular, as one of the various controls mentioned above, the ECU 3 outputs the ignition instruction signal IGT (=a pulse signal driven by PWM) used to control the operation of the igniter 10 (in particular, the switch element control device 12). More specifically, the ECU 3 turns the ignition instruction signal IGT to an on-period logic level (e.g., high level) to turn on the switch element 111, and turns the ignition instruction signal IGT to an off-period logic level (e.g., low level) to turn off the switch element 111.

(1-2. Configuration of Igniter)

Here, a description will be given of a more specific configuration of the igniter 10.

As described previously, the switch element chip 11 includes the switch element 111 and the temperature sensor 112. Further, the switch element chip 11 includes, as electrode pads for establishing external electrical connection, a collector pad Pc, an emitter pad Pe, a gate pad Pg1, and anode pad Pad1, and a cathode pad Pcd1.

The collector of the switch element 111 is connected to the second end of the primary-side coil 21 via the collector pad Pc. The emitter of the switch element 111 is connected to a ground-voltage application terminal via the emitter pad Pe. The gate of the switch element 111 is connected to the switch element control device 12 via the gate pad Pg1. When the switch element 111 is in an ON state, the collector current Ic flows via the primary-side coil 21, the collector pad Pc, the switch element 111, and the emitter pad Pe.

The temperature sensor 112 includes one or more diodes. In a case where the temperature sensor 112 includes a plurality of diodes 112, the plurality of diodes 112 are connected in series. As a result, the temperature sensor 112 has an anode end 112A and a cathode end 112B. The anode end 112A of the temperature sensor 112 is connected, via the anode pad Pad1, to the switch element control device 12. The cathode end 112B of the temperature sensor 112 is connected, via the cathode pad Pcd1, to the switch element control device 12.

Further, as mentioned previously, the switch element control device 12 includes the switch element control circuit 121 and the temperature detection circuit 122. Further, the switch element control device 12 includes, as electrode pads for establishing external electrical connection, a power supply pad Pvdd, an input pad Pin, a gate pad Pg2, an anode pad Pad2, a cathode pad Pcd2, and a ground pad Pgnd. To the power supply pad Pvdd, the power supply voltage Vdd output from the power supply 2 is applied.

The switch element control circuit 121 generates the gate signal Sg according to the ignition instruction signal IGT input from the ECU 3 via the input pad Pin. Specifically, when the ignition instruction signal IGT is at the on-period logic level, a high-level gate signal Sg is generated, and, when the ignition instruction signal IGT is at the off-period logic level, a low-level gate signal Sg is generated. The gate pad Pg2 and the gate pad Pg1 are connected to each other by a bonding wire W1. As a result, the gate signal Sg is applied, via the gate pads Pg2 and Pg1, to the gate of the switch element 111. When the gate signal Sg is at high level, the switch element 111 is in the ON state, and when the gate signal Sg is at low level, the switch element 111 is in an OFF state.

The temperature detection circuit 122 includes a constant current circuit 122A and a comparator 122B. The anode pad Pad2 and the anode pad Pad1 are connected to each other by a bonding wire W2. The cathode pad Pcd2 and the cathode pad Pcd1 are connected to each other by a bonding wire W3. The constant current circuit 122A flows a constant current I122 through a passage via the anode pads Pad2 and Pad1, the temperature sensor 112, the cathode pads Pcd1 and Pcd2, and the ground pad Pgnd. The temperature sensor 112 detects temperature by making use of the fact that, with the constant current I122 supplied, a forward voltage Vf changes according to change of temperature. The higher the temperature is, the lower the forward voltage Vf becomes.

The non-inverting input terminal (+) of the comparator 122B is connected, via the anode pads Pad2 and Pad1, to the anode end 112A of the temperature sensor 112. Input to the inverting input terminal (−) of the comparator 122B is a reference voltage Vref that is based on the potential of the ground pad Pgnd. As a result, the comparator 122B detects an overheated state by comparing the forward voltage Vf with the reference voltage Vref. More specifically, when the forward voltage Vf is higher than the reference voltage Vref, the comparator 122B determines that the temperature is normal and outputs a high-level comparison signal Scmp, and, when the forward voltage Vf is equal to or lower than the reference voltage Vref, the comparator 122B outputs a low-level comparison signal Scmp to notify an overheated state.

The switch element control circuit 121 generates the gate signal Sg according to the comparison signal Scmp. More specifically, when the comparison signal Scmp is at high level, the switch element control circuit 121 generates the gate signal Sg according to the ignition instruction signal IGT, and performs normal switching of the switch element 111. When the comparison signal Scmp is at low level, the switch element control circuit 121 turns the gate signal Sg to low level to turn off the switch element 111, and stops the switching of the switch element 111. As a result, it is possible to turn off the switch element 111 when an overheated state is caused by heat generated by the switch element 111 to prevent the collector current Ic from flowing. In this manner, by the temperature sensor 112, the temperature detection circuit 122, and the switch element control circuit 121, the TSD (thermal shutdown) function is accomplished.

Figure 2:
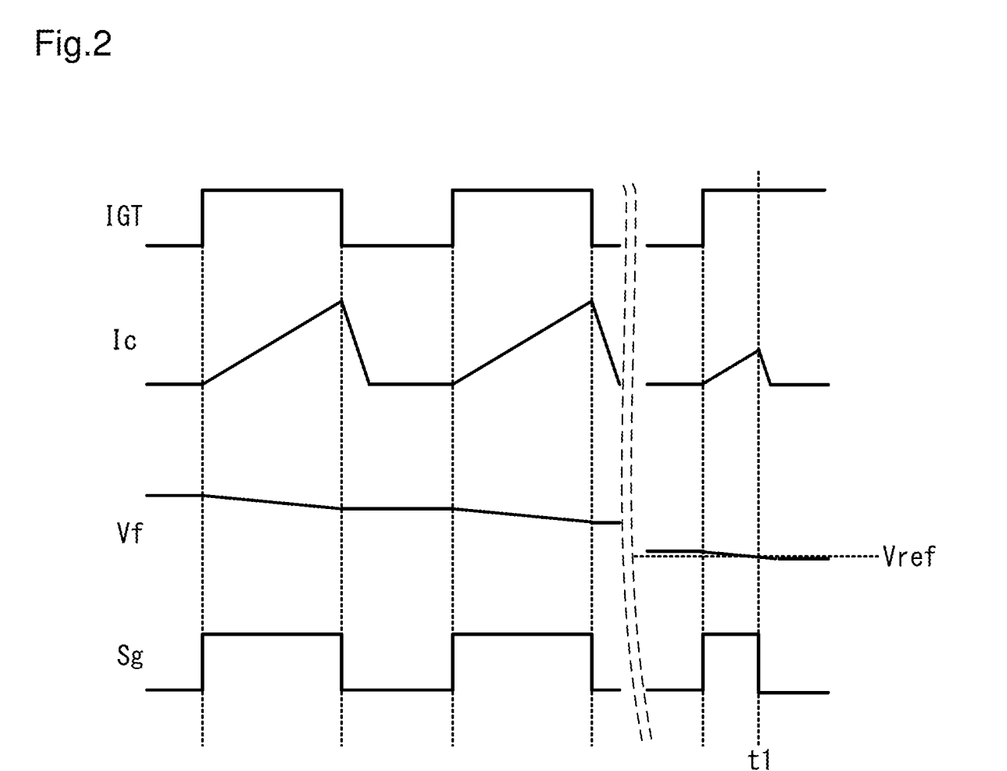
FIG. 2 is a timing chart showing an operation example of a thermal shutdown function.

Here, one example of circuit operation in the igniter 10 will be described with reference to the timing chart shown in FIG. 2. FIG. 2 shows, in downward order from the top of the figure, examples of the waveforms of the ignition instruction signal IGT, the collector current Ic, the forward voltage Vf of the temperature sensor 112, and the gate signal Sg.

As shown in FIG. 2, when the ignition instruction signal IGT is switched from low level to high level, the gate signal Sg is turned to high level, the switch element 111 is turned on, and the collector current Ic starts to flow. In the period during which the ignition instruction signal IGT is at high level, the collector current Ic increases. Then, when the ignition instruction signal IGT is switched from high level to low level, the gate signal Sg is turned to low level, the switch element 111 is turned off, and the collector current Ic stops flowing. By repetition of this operation, switching of the switch element 111 is performed.

In the example shown in FIG. 2, during the switching of the switch element 111, the switch element 111 is caused to generate heat by the collector current Ic, so that the temperature of the switch element 111 rises. As a result, the forward voltage Vf is lowered. And, in FIG. 2, at timing t1 at which the forward voltage Vf becomes equal to or lower than the reference voltage Vref, an overheated state is detected (the comparison signal Scmp is turned to low level), and by the switch element control circuit 121, the gate signal Sg is turned to low level. As a result, the switch element 111 is turned off, and the switching thereof is stopped. Consequently, the collector current Ic stops flowing.

2. Problem to be Solved in the Comparative Example

Figure 3:
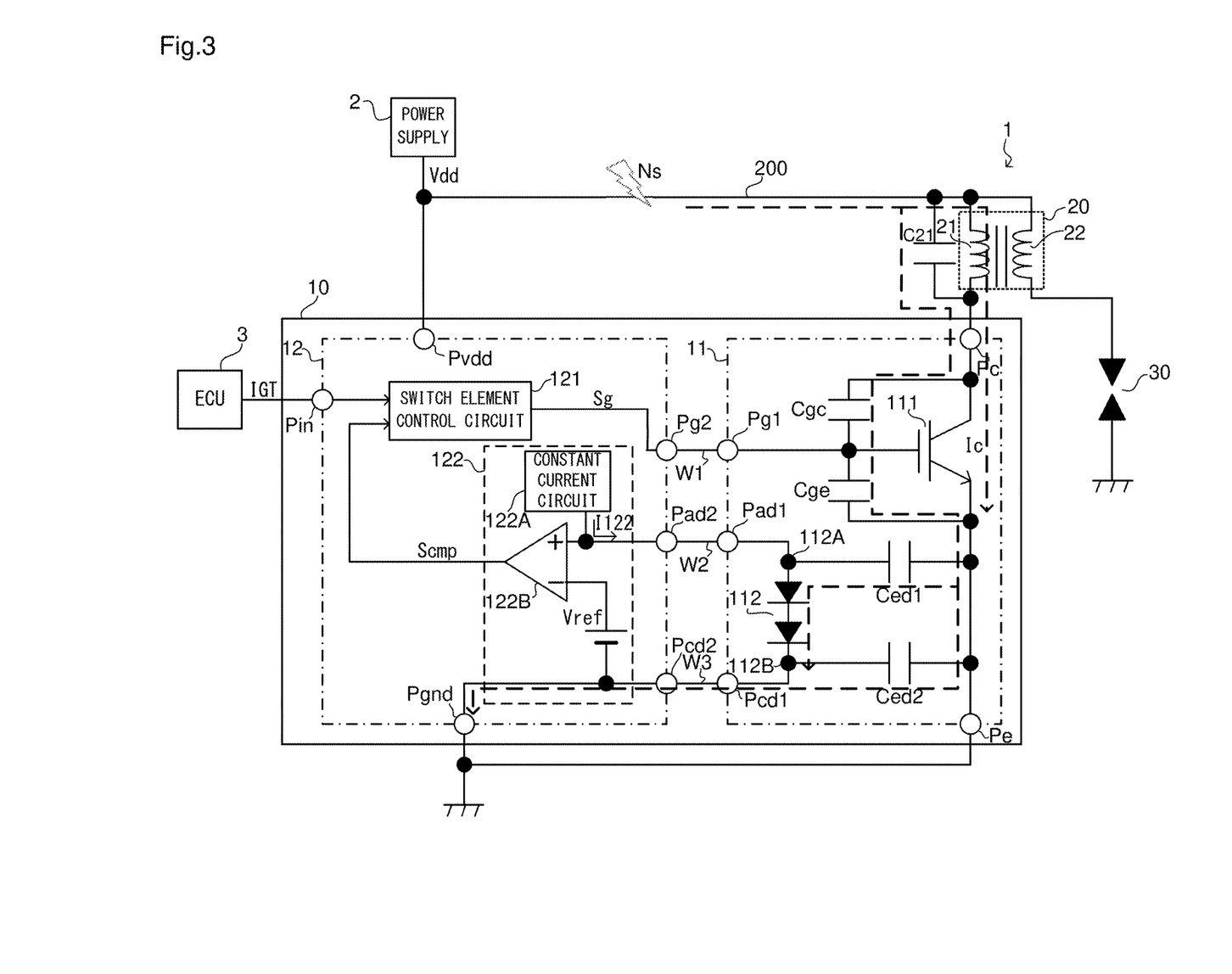
FIG. 3 is a diagram for illustrating a problem to be dealt with in the comparative example.

A problem to be solved in the igniter 10 according to this comparative example will be described with reference to FIG. 3. As shown in FIG. 3, noise Ns can be injected into a power supply line 200 by a BCI test and the like. The power supply line (power supply harness) 200 is a line that connects an output end of the power supply 2 and the first end of the primary-side coil 21 to each other.

In FIG. 3, a propagation path for the noise Ns is indicated by a dashed arrow. The noise Ns is propagated, via a parasitic capacitor C21 of the primary-side coil 21 and parasitic capacitors Cgc and Cge of the switch element 111, to the emitter of the switch element 111. Further, the noise Ns is superimposed on the collector current Ic, and propagated to the emitter of the switch element 111. Then, the noise Ns having been propagated to the emitter passes through parasitic capacitors Ced1 and Ced2 between the emitter and the diodes (the temperature sensor 112), to be propagated to the ground pad Pgnd via the bonding wire W3 which connects the cathode pads Pcd1 and Pcd2 to each other. As a result, the circuits inside the switch element control device 12 become liable to be influenced by the noise Ns, and thus are at risk of malfunctioning.

Further, in the comparative example, there can be considered connecting the cathode end 112B of the temperature sensor 112 and the emitter of the switch element 111 to each other by means of a connection line, thereby to obtain the ground potential of the ground pad Pgnd via the bonding wire W3 and the connection line. Unfortunately, however, in that case, the noise Ns having been propagated to the emitter would be propagated to the ground pad Pgnd via the connection line. Further, there is a risk that impedance of the bonding wire connected to the emitter pad Pe and the collector current Ic may affect and raise the potential of the ground pad Pgnd. In that case, there is a risk that, in the switch element control device 12, voltages between the power supply voltage Vdd and the ground and between the ECU 3 voltage and the ground will fall, making it impossible to meet the electric specifications. Or, there is a risk of necessity of a complex IC design that takes rise of ground potential into account. Further, there is also a risk that the length of the bonding wire W3 will need to be made as short as possible, which will reduce the freedom in designing the circuit arrangement inside the igniter 10.

Thus, the following embodiment according to the present disclosure will be implemented to solve the problems described above.

3. Igniter according to Embodiment of Present Disclosure

<3-1. Circuit Configuration of Igniter>

Figure 4:
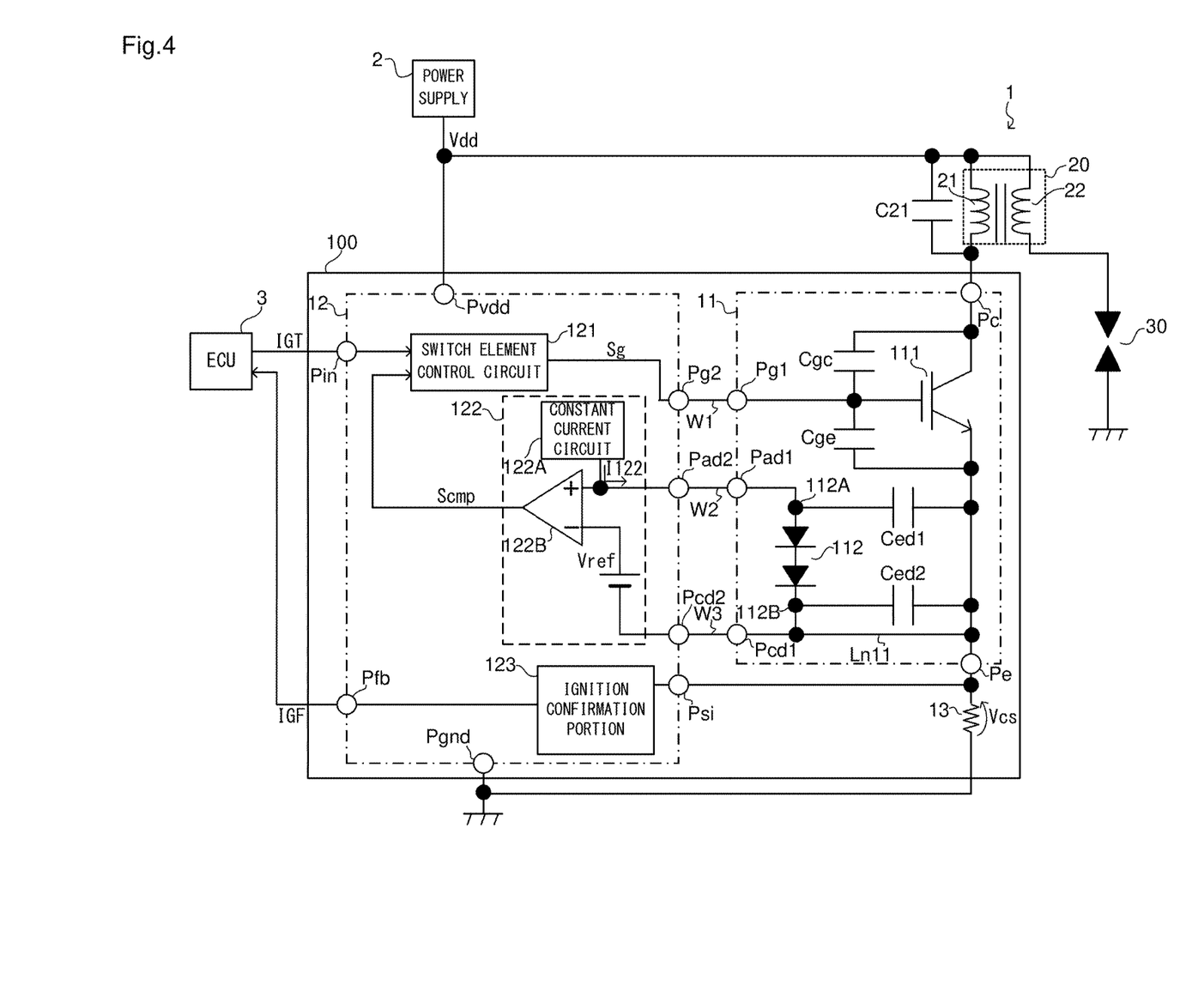
FIG. 4 is a diagram showing a configuration of an engine ignition device according to an exemplary embodiment of the present disclosure.

FIG. 4 is a diagram showing a circuit configuration of an igniter 100 according to an exemplary embodiment of the present disclosure. The igniter 100 has a configuration obtained by improving the igniter 10 according to the above-discussed comparative example.

The igniter 100 is different from the igniter 10 in configuration in that, in the switch element control device 12, the ground pad Pgnd is electrically isolated from the cathode pad Pcd2. Further, in the switch element chip 11, the cathode end 112B of the temperature sensor 112 and the emitter pad Pe are connected to each other by a connection line Ln11.

In this manner, with the ground pad Pgnd electrically isolated from the cathode pad Pcd2, even in a case where the noise Ns is propagated to the emitter of the switch element 111 as previously described, the noise propagation path via the parasitic capacitors Ced1 and Ced2 and the bonding wire W3 to the ground pad Pgnd does not exist. Consequently, the circuits inside the switch element control device 12 become less liable to be influenced by noise, and this helps suppress the occurrence of malfunction.

Further, even with the ground pad Pgnd electrically isolated from the cathode pad Pcd2, it is possible to flow the constant current 1122 via the temperature sensor 112 and the connection line Ln11 to the emitter pad Pe. Further, since the ground pad Pgnd is electrically isolated from the cathode pad Pcd2, by using a differential comparator as the comparator 122B, the comparator 122B can perform an operation of comparing the cathode-based forward voltage Vf and the cathode-based reference voltage Vref.

Further, since there is no need to obtain the ground potential of the ground pad Pgnd via the bonding wire W3, limitation to the length of the bonding wire W3 is alleviated, and this helps improve the degree of freedom in designing the arrangement of the circuits inside the igniter 100.

Furthermore, in the igniter 100, a current detection resistor 13 is provided. The switch element control device 12 includes an ignition confirmation portion 123, and also includes a sense input pad Psi and a feedback pad Pfb as electrode pads.

A first end of the current detection resistor 13 is connected to the emitter pad Pe and the sense input pad Psi. A second end of the current detection resistor 13 is connected to the ground potential application terminal.

The current detection resistor 13 is an element for detecting the collector current Ic. When the switch element 111 is in the ON state, the collector current Ic flows in the current detection resistor 13. Consequently, across the current detection resistor 13, a detection voltage Vcs is generated by subjecting the collector current Ic to current-to-voltage conversion.

The ignition confirmation portion 123 generates an ignition confirmation signal IGF on the basis of the collector current Ic, and outputs the ignition confirmation signal IGF via the feedback pad Pfb to the ECU 3. The ignition confirmation portion 123 compares the collector current Ic with reference currents Iref1 and Iref2 (>Iref1), and thereby generates the ignition confirmation signal IGF. Actually, the ignition confirmation portion 123 compares the detection voltage Vcs with a reference voltage Vref1 corresponding to the reference current Iref1 and a reference voltage Vref2 (>Vref1) corresponding to the reference current Iref2, and thereby generates the ignition confirmation signal IGF. The ignition confirmation portion 123 turns the ignition confirmation signal IGF to a first level (e.g., low level) in a case where the detection voltage Vcs is a voltage between the reference voltage Vref1 and the reference voltage Vref2 (Vref1<Vc<Vref2), and, in the other cases (Vc<Vref1, Vref2<Vc), the ignition confirmation portion 123 turns the ignition confirmation signal IGF to a second level (e.g., high level).

The electrical isolation of the ground pad Pgnd from the cathode pad Pcd2 helps suppress rise of the potential of the ground pad Pgnd due to influence of the collector current Ic, the impedance of a (later-described) bonding wire connected to the emitter pad Pe, and the current detection resistor 13.

<3-2. Layout Configuration of Igniter>

Figure 5:
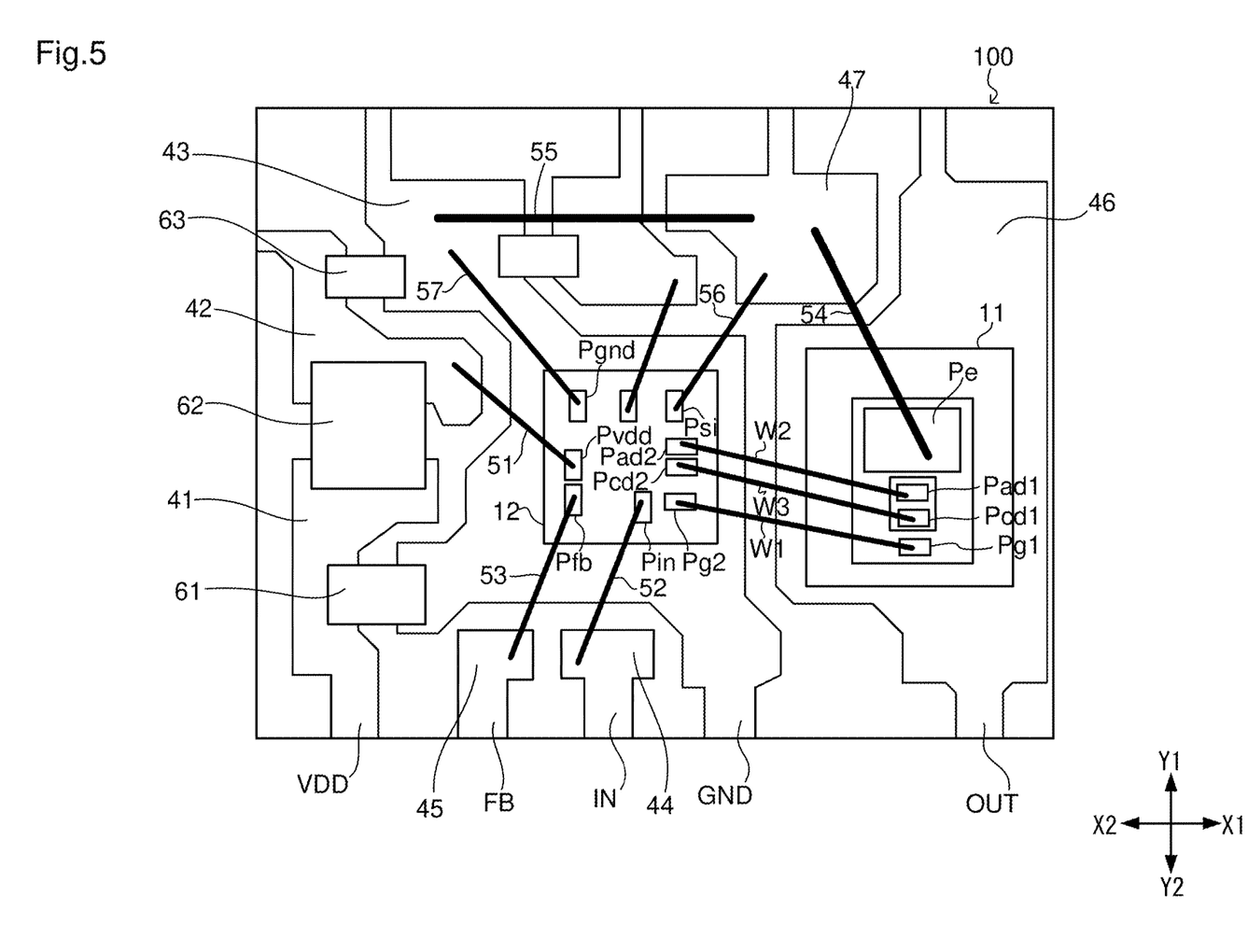
FIG. 5 is a plan view showing a layout of an internal configuration of the engine ignition device according to the exemplary embodiment of the present disclosure.

FIG. 5 is a plan view showing an example of a layout of an internal configuration of the igniter 100. The igniter 100 is a package formed by sealing with a sealing member such as a resin. The igniter 100 includes leads (lead frames) 41 to 47. The layout shown in FIG. 5 will be described using a direction X along one side of the package having a rectangular shape in plan view, and a direction Y that is orthogonal to the direction X. In FIG. 5, a first side and a second side in the direction X will be denoted by X1 and X2, and a first side and a second side in the direction Y will be denoted by Y1 and Y2.

The lead 41 has a power supply terminal VDD, and is disposed, in the package, at an end part that is on the second side in the direction X and on the second side in the direction Y. The lead 42 is disposed adjacent to the lead 41, on the first side in the direction Y. The lead 43 has a ground terminal GND, and is formed, in the package, from an end part on the second side in the direction Y to an end part on the first side in the direction Y. The lead 43 is disposed adjacent to the leads 41 and 42, on the first side in the direction X.

The lead 44 has an input terminal IN, and is disposed, in the package, at an end part on the second side in the direction Y. The lead 45 has a feedback terminal FB, and is disposed adjacent to the lead 44, on the second side in the direction X. The leads 44 and 45 are disposed adjacent to the lead 43, on the second side in the direction Y.

The lead 46 has an OUT terminal, and is disposed adjacent to the lead 43, on the first side in the direction X. The lead 46 is formed, in the package, from an end part on the second side in the direction Y to an end part on the first side in the direction Y. The lead 47 is disposed adjacent to the leads 46 and 43, on the one side in the direction Y.

On the lead 43, the switch element control device 12, which is an IC chip, is mounted. On the front face (the front side of the sheet on which the figure is drawn) of the switch element control device 12, the power supply pad Pvdd, the feedback pad Pfb, the input pad Pin, the gate pad Pg2, the cathode pad Pcd2, the anode pad Pad2, the sense input pad Psi, and the ground pad Pgnd are formed.

As shown in FIG. 5, the ground pad Pgnd and the cathode pad Pcd2 are disposed along different edges of the switch element control device 12 having a rectangular shape in plan view. As a result, the ground pad Pgnd and the cathode pad Pcd2 are disposed as far away as possible from each other, so that electric connection is suppressed between the cathode pad Pcd2 and the ground pad Pgnd.

The power supply pad Pvdd is connected to the lead 42 by a bonding wire 51. The input pad Pin is connected to the lead 44 by a bonding wire 52. The feedback pad Pfb is connected to the lead 45 by a bonding wire 53.

On the lead 46, the switch element chip 11 is mounted. The switch element chip 11 has the emitter pad Pe, the anode pad Pad1, the cathode pad Pcd1, and the gate pad Pg1 on its front-face side (the front side of the sheet on which the figure is drawn), and also has the collector pad (rear-face electrode) Pc on its rear side (the rear side of the sheet on which the figure is drawn). The collector pad Pc is connected to the lead 46. As a result, the collector of the switch element 111 is connected via the collector pad Pc to the OUT terminal. The OUT terminal is connected to the second end of the primary-side coil 21 (FIG. 4).

The gate pad Pg1 is connected to the gate pad Pg2 by the bonding wire W1. The anode pad Pad1 is connected to the anode pad Pad2 by the bonding wire W2. The cathode pad Pcd1 is connected to the cathode pad Pcd2 by the bonding wire W3.

In the present embodiment, the emitter pad Pe is not directly connected to the lead 43, but is connected to the lead 47 by a bonding wire 54. The lead 47 is connected to the lead 43 by a bonding wire 55. The lead 47 is connected to the sense input pad Psi by a bonding wire 56. The lead 43 is connected to the ground pad Pgnd by a bonding wire 57. Consequently, a resistance component of the bonding wire 55 is used as the current detection resistor 13.

The bonding wires 51 to 57 and the bonding wires W1 to W3 are composed of Al, for example. Note that the bonding wires 51 to 57 and the bonding wires W1 to W3 may be made of other metals, such as Al alloy, Au, and Cu. For improved accuracy of detection by the ignition confirmation portion 123, it is necessary to increase the resistance of the current detection resistor 13. Thus, for a larger resistance, it is preferable that the bonding wire 55 be made of Al. Further, a comparatively large current flows through the bonding wires 54 and 55, and thus they are made of a thicker wire than the other bonding wires.

Due to repeated heat generation and cooling of the switch element 111 in a power cycle, the sealing member around the bonding wire 54 repeats expansion and contraction. However, the lead 47 and the bonding wire 55 are not liable to be influenced by the power cycle. Consequently, even in a case where, due to the influence of the power cycle, the connection portion between the bonding wire 54 and the emitter pad Pe is deteriorated, change of the resistance value of the current detection resistor 13 is suppressed. As a result, malfunction of the ignition confirmation portion 123 is suppressed.

Note that the igniter 100 is provided with a high-frequency filter, illustration of which is omitted in FIG. 4, disposed between the power supply terminal VDD and the power supply pad Pvdd of the switch element control device 12. The high-frequency filter is a π-type lowpass filter including capacitors 61 and 63 and a resistor 62. The resistor 62 is bridge-connected between the lead 41 (the power supply terminal VDD) and the lead 42. The capacitor 61 is bridge-connected between the lead 41 and the lead 43 (the ground terminal GND). The capacitor 63 is bridge-connected between the lead 42 and the lead 43 (the ground terminal GND). The lead 42 is connected to the power supply pad Pvdd by the bonding wire 51. As a result, the high-frequency filter is formed which removes high-frequency noise input through the power supply terminal VDD.

4. Others

It should be understood that the foregoing embodiments are merely illustrative, and various modifications can be made and implemented within the scope not departing from the gist of the present invention.

5. Supplementary Notes

As described above, according to one aspect of the present disclosure, an igniter (100) includes a switch element (111) having a first end, a temperature sensor (112) including at least one diode and having a cathode end (112B), a switch element control device (12) configured to control the switch element, and a switch element electrode (Pe) connected to the first end of the switch element and to the cathode end, and the switch element control device has a ground electrode (Pgnd) electrically isolated from the cathode end (a first configuration).

Further, the first configuration described above may further include a temperature detection circuit (122) including a constant current circuit (122A) configured to supply a constant current to the temperature sensor, and the temperature detection circuit may be configured to detect an overheated state on the basis of a forward voltage (Vf) of the temperature sensor (a second configuration).

Further, in the second configuration described above, the temperature detection circuit may include a differential comparator (122B) configured to compare the forward voltage based on the cathode end and a reference voltage (Vref) based on the cathode end (a third configuration).

Further, in any one of the first to third configurations described above, the switch element and the temperature sensor may be formed on a same switch element chip (11) (a fourth configuration).

Further, in the fourth configuration described above, the switch element chip may have a first cathode electrode (Pcd1) connected to the cathode end, and the switch element control device may have a second cathode electrode (Pcd2) connected to the first cathode electrode by a first bonding wire (W3) (a fifth configuration).

Further, in the fifth configuration described above, the second cathode electrode and the ground electrode may be disposed along different edges of the switch element control device rectangular-shaped in plan view (a sixth configuration).

Further, any one of the first to sixth configurations described above may further include a first lead (43) connected to the ground electrode by the second bonding wire (57) (a seventh configuration).

Further, the seventh configuration described above may further include a second lead (47) connected to the switch element electrode by a third bonding wire (54), the second lead and the first lead may be connected to each other by a fourth bonding wire (55), and the switch element control device may have a sense input electrode (Psi) connected to the second lead by a fifth bonding wire (56) and an ignition confirmation portion (123) connected to the sense input electrode (an eighth configuration).

Further, in any one of the first to eighth configurations described above, the switch element may be an ICBT having an emitter as the first end, and the switch element electrode may be an emitter pad (a ninth configuration).

According to another aspect of the present disclosure, an engine ignition device (1) includes the igniter (100) according to any one of the first to ninth configurations described above, an ignition coil (20) including a primary-side coil (21) connected to a second end of the switch element and a secondary-side coil (22), and an ignition plug (30) connected to the secondary-side coil.

INDUSTRIAL APPLICABILITY

The present disclosure is usable in an igniter.

REFERENCE SIGNS LIST 1 engine ignition device
2 power supply
3 ECU
10 igniter
11 switch element chip
12 switch element control device
13 current detection resistor
20 ignition coil
21 primary-side coil
22 secondary-side coil
30 ignition plug
41 to 47 lead
51 to 57 bonding wire
61, 63 capacitor
62 resistor
100 igniter
111 switch element
112 temperature sensor
112A anode end
112B cathode end
121 switch element control circuit
122 temperature detection circuit
122A constant current circuit
122B comparator
123 ignition confirmation portion
200 power supply line
C21 parasitic capacitor
Ced1, Ced2 parasitic capacitor
Cgc, Cge parasitic capacitor
FB feedback terminal
GND ground terminal
IN input terminal
Ln11 connection line
Pad1, Pad2 anode pad
Pc collector pad
Pcd1, Pcd2 cathode pad
Pe emitter pad
Pfb feedback pad
Pg1, Pg2 gate pad
Pgnd ground pad
Pin input pad
Psi sense input pad
Pvdd power supply pad
VDD power supply terminal
W1 to W3 bonding wire

The invention claimed is:

1. An igniter comprising:
a switch element having a first end;
a temperature sensor including at least one diode, wherein the at least one diode includes a cathode end;
a switch element control device configured to control the switch element; and
a switch element electrode connected to the first end of the switch element and to the cathode end,
wherein
the switch element control device has a ground electrode electrically isolated from the cathode end such that no current path exists through which the cathode end connects to the ground electrode inside the switch element control device.

2. The igniter according to claim 1, further comprising:
a temperature detection circuit including a constant current circuit configured to supply a constant current to the temperature sensor,
wherein
the temperature detection circuit is configured to detect an overheated state on the basis of a forward voltage of the temperature sensor.

3. The igniter according to claim 2,
wherein
the temperature detection circuit includes a differential comparator configured to compare the forward voltage based on the cathode end and a reference voltage based on the cathode end.

4. The igniter according to claim 1,
wherein
the switch element and the temperature sensor are formed on a same switch element chip.

5. The igniter according to claim 4,
wherein
the switch element chip has a first cathode electrode connected to the cathode end, and
the switch element control device has a second cathode electrode connected to the first cathode electrode by a first bonding wire.

6. The igniter according to claim 5,
wherein the second cathode electrode and the ground electrode are disposed along different edges of the switch element control device rectangular-shaped in plan view.

7. The igniter according to claim 1, further comprising:
a first lead connected to the ground electrode by the second bonding wire.

8. The igniter according to claim 7, further comprising:
a second lead connected to the switch element electrode by a third bonding wire,
wherein
the second lead and the first lead are connected to each other by a fourth bonding wire, and
the switch element control device has a sense input electrode connected to the second lead by a fifth bonding wire and an ignition confirmation portion connected to the sense input electrode.

9. The igniter according to claim 1,
wherein
the switch element is an IGBT having an emitter as the first end, and
the switch element electrode is an emitter pad.

10. An engine ignition device, comprising:
the igniter according to claim 1;
an ignition coil including a primary-side coil connected to a second end of the switch element and a secondary-side coil; and
an ignition plug connected to the secondary-side coil.

* * * * *